United States Patent
Araki et al.

(10) Patent No.: US 8,416,115 B2
(45) Date of Patent: Apr. 9, 2013

(54) SUCCESSIVE APPROXIMATION REGISTER-ANALOG DIGITAL CONVERTER AND RECEIVER

(75) Inventors: Mai Araki, Kawasaki (JP); Masanori Furuta, Odawara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 84 days.

(21) Appl. No.: 13/035,202

(22) Filed: Feb. 25, 2011

(65) Prior Publication Data

US 2012/0056770 A1   Mar. 8, 2012

(30) Foreign Application Priority Data

Sep. 6, 2010   (JP) .................................. 2010-198812

(51) Int. Cl.
*H03M 1/12*   (2006.01)
*H03M 1/80*   (2006.01)
(52) U.S. Cl. ...................................................... 341/172
(58) Field of Classification Search .................. 341/118, 341/120, 150, 154, 172
See application file for complete search history.

(56) References Cited

U.S. PATENT DOCUMENTS

| | | | | |
|---|---|---|---|---|
| 4,097,753 A  * | 6/1978 | Cook et al. | ....................... | 327/72 |
| 8,199,041 B2 * | 6/2012 | Nakajima | ..................... | 341/156 |
| 2010/0156689 A1* | 6/2010 | Kuramochi et al. | .......... | 341/146 |

OTHER PUBLICATIONS

Chen, S. W-M et al., A 6-bit 600-MS/s 5.3-mW Asynchronous ADC in 0.13- micrometer CMOS, IEEE Journal of Solid-State Circuits, vol. 41 , Issue: 12, Dec. 2006, pp. 2669-2680.*
Alpman, E. et al. A 1.1V 50mW 2.5GS/s 7b Time-Interleaved C-2C SAR ADC in 45nm LP Digital CMOS, IEEE International Solid-State Circuits Conference—Digest of Technical Papers, 2009, ISSCC 2009, Feb. 8-12, 2009, pp. 76-77,77a plus supplement.*
Cong, L. et al. A New Charge Redistribution D/A and A/D Converter Technique-Pseudo C-2C Ladder, Proceedings of the 43rd IEEE Midwest Symposium on Circuits and Systems, 2000, pp. 498-501 vol. 1, Date of Conference: 2000.*
Yang, J. et al., A 1 GS/s 6 Bit 6.7 mW Successive Approximation ADC Using Asynchronous Processing, , IEEE Journal of Solid-State Circuits, vol. 45 , Issue: 8, pp. 1469-1478, Date of Publication: Aug. 2010.*
Franz Kuttner, "A 1.2V 10b 20MSample/s Non-Binary Successive Approximation ADC in 0.13μm CMOS", 2002 IEEE International Solid-State Circuits Conference, Feb. 5, 2002, 2 pages.
Shuo-Wei Michael Chen, et al., "A 6-bit 600-MS/s 5.3-mW Asynchronous ADC in 0.13-μm CMOS", IEEE Journal of Solid-State Circuits, vol. 41, No. 12, Dec. 2006, pp. 2669-2680.
Lin Cong, "Pseudo C-2C Ladder-Based Data Converter Technique", IEEE Transactions on Circuits and Systems-II: Analog and Digital Signal Processing, vol. 48, No. 10, Oct. 2001, pp. 927-929.
Office Action mailed Dec. 14, 2012, in Japanese Application. No. 2010-198812, filed Sep. 6, 2010 (w/English translation), pp. 1-3.

* cited by examiner

*Primary Examiner* — Howard Williams
(74) *Attorney, Agent, or Firm* — Oblon, Spivak, McClelland, Maier & Neustadt, L.L.P.

(57) ABSTRACT

An SAR-ADC includes input and reference terminals, first and second capacitor sets, a dummy capacitor, a comparator, a switch, and a logic. The first and second capacitor sets include first and second capacitors, respectively. The first capacitor has a first capacitance. The second capacitor has a second capacitance. The dummy capacitor has a third capacitance. The comparator compares an output voltage with a ground voltage and outputs a digital output code in accordance with a difference between the output and ground voltages. The switch is connected among the first capacitors of the first and second capacitor sets, and the reference terminal. The logic turns the switch based on the digital output code. The input terminal is located between the first and second capacitors of the first capacitor set. The second capacitor of the first capacitor set is located between the first and second capacitors of the second capacitor set.

8 Claims, 11 Drawing Sheets

SUCCESSIVE APPROXIMATION REGISTER-ANALOG DIGITAL CONVERTER AND RECEIVER

CROSS REFERENCE TO RELATED APPLICATIONS

This application is based upon and claims the benefit of priority from the prior Japanese Patent Application No. 2010-198812, filed on Sep. 6, 2010, the entire contents of which are incorporated herein by reference.

FIELD

The present invention relates to a successive approximation register-analog digital converter (hereinafter referred to as "SAR-ADC") and a receiver.

BACKGROUND

Recently, in devices such as a high-speed wireless communication device and video device, an analog digital converter (hereinafter referred to as "ADC") having a sampling frequency of the order of a gigahertz tends to be implemented by silicon-on-chip. Accordingly, the ADC that has high-resolution, low-power-consumption, and small-area ADC is demanded.

An SAR-ADC is well known as such ADC. The SAR-ADC is implemented by a comparator, a capacitive digital analog converter (hereinafter referred to as "DAC"), and a simple logic. The SAR-ADC attracts attention as the ADC that has low-power-consumption and small-area.

In the SAR-ADC, when a capacitive DAC has an ideal binary weight, an ideal digital output code is obtained with respect to an analog input signal. However, a signal (hereinafter referred to as "missing code") to which AD (Analog to Digital) conversion is not performed may be generated because the weight actually changes according to a parasitic capacitance. Accordingly, in the SAR-ADC, a digital correction circuit that corrects the missing code is needed.

In the conventional digital correction circuit, the missing code is corrected by adding redundancy to the ADC using a redundant conversion algorithm. However, the conventional digital correction circuit that uses the redundant conversion algorithm becomes complicated, and therefore a circuit area of the SAR-DAC is enlarged.

DETAILED DESCRIPTION

Embodiments will now be explained with reference to the accompanying drawings.

In general, according to one embodiment, a successive approximation register-analog digital converter includes an input terminal, a reference terminal, a first capacitor set, a second capacitor set, a dummy capacitor, a comparator, a switch, and a logic circuit. An input voltage is applied to the input terminal. A reference voltage is applied to the reference terminal. The first capacitor set includes a first capacitor and a second capacitor. The first capacitor has a first capacitance. The second capacitor has a second capacitance that is double a sum of the first capacitance and a parasitic capacitance that is parasitic in the first capacitor set. The second capacitor set includes the first capacitor and the second capacitor. The dummy capacitor has a third capacitance that is less than the second capacitance and located between the second capacitor of the second capacitor set and a ground. The comparator compares an output voltage corresponding to charges charged in the first capacitor of the first capacitor set and the second capacitor of the first capacitor set with a ground voltage, and outputs a digital output code in accordance with a difference between the output voltage and the ground voltage. The switch is connected among the first capacitor of the first capacitor set, the first capacitor of the second capacitor set, and the reference terminal. The logic circuit turns the switch based on the digital output code to control the output voltage. The input terminal is located between the first capacitor of the first capacitor set and the second capacitor of the first capacitor set. The second capacitor of the first capacitor set is located between the first capacitor of the second capacitor set and the second capacitor of the second capacitor set.

Figure 1:
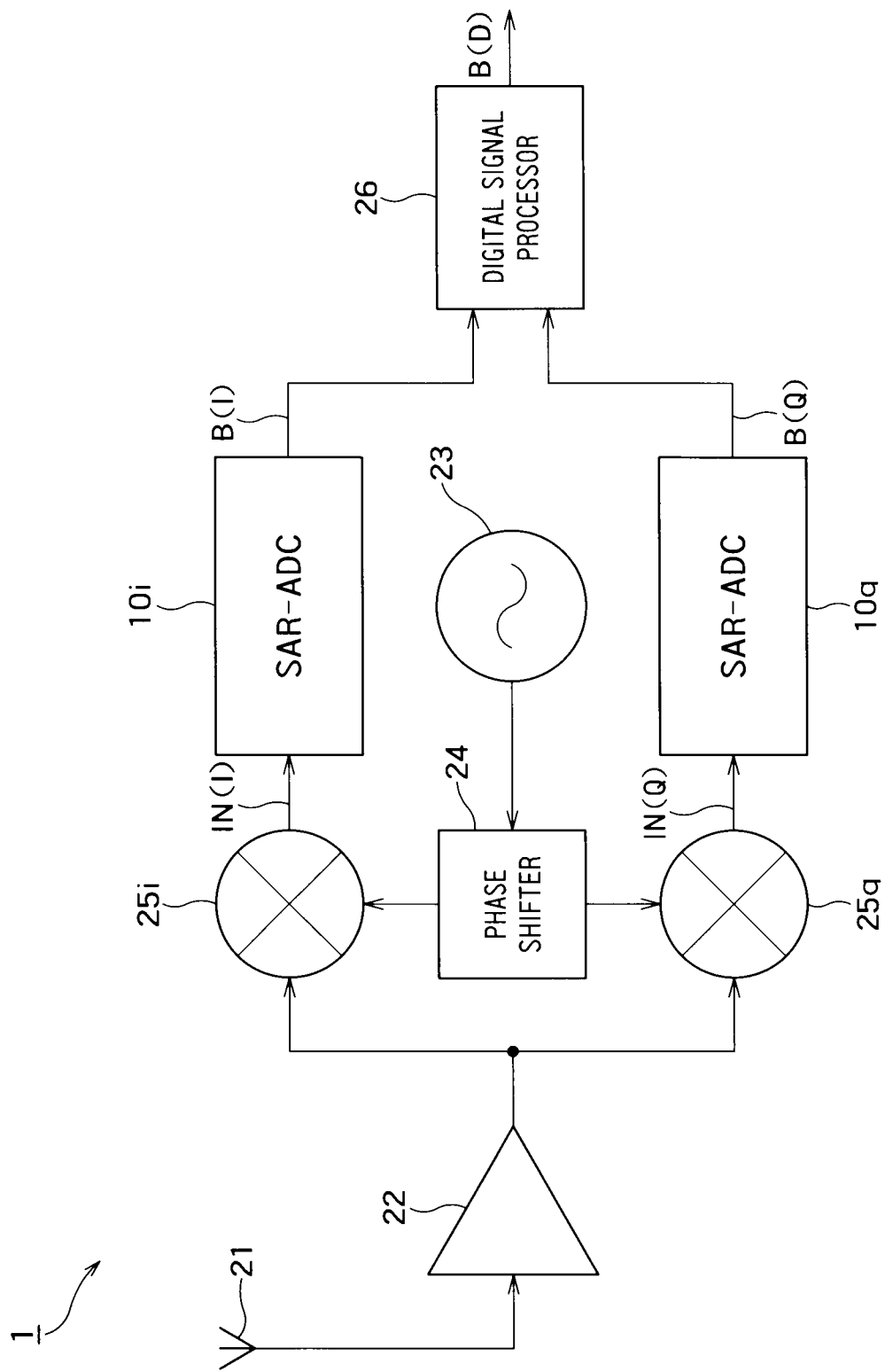
FIG. 1 is a schematic diagram illustrating the configuration of the receiver of the embodiment.

First, a configuration of a receiver according to an embodiment will be explained below. FIG. 1 is a schematic diagram illustrating the configuration of the receiver of the embodiment.

As illustrated in FIG. 1, a receiver 1 includes an antenna 21, a low noise amplifier (hereinafter referred to as "LNA") 22, a local oscillator 23, a phase shifter 24, frequency converters 25i and 25q, SAR-ADCs 10i and 10q, and a digital signal processor 26.

The antenna 21 is a module that receives a radio signal transmitted from a base station (not illustrated) and inputs the received radio signal to the LNA 22.

The LNA 22 is a module that amplifies the radio signal inputted from the antenna 21 to a predetermined level and inputs the amplified radio signal to the frequency converters 25i and 25q.

The local oscillator 23 is a module that generates a local signal necessary to convert the radio signal into an analog baseband signal and inputs the generated local signal to the phase shifter 24.

The phase shifter 24 is a module that distributes the local signal inputted from the local oscillator 23 into two local signals. More specifically, the phase shifter 24 inputs one of the local signals to the frequency converter 25i, and delays a phase of the other of the local signals by 90 degrees to input the delayed local signal to the frequency converter 25q.

Each of the frequency converters 25i and 25q is a module that converts the radio signal into the analog baseband signal (hereinafter referred to as "analog input signal IN") by multiplying the radio signal inputted from the LNA 22 and the local signal inputted from the phase shifter 24, and inputs the converted analog input signal IN to the SAR-ADCs 10i and 10q. An analog input signal IN(I) inputted to the SAR-ADC 10i is an in-phase signal. An analog input signal IN(Q) inputted to the SAR-ADC 10q is a quadrature phase signal.

Each of the SAR-ADCs 10i and 10q is a module that converts the analog input signal IN inputted from each of the frequency converters 25i and 25q into a digital baseband signal B, and inputs the converted digital baseband signal B to the digital signal processor 26. A digital baseband signal B(I) converted by the SAR-ADC 10i is a digital signal converted from the in-phase signal. A digital baseband signal B(Q) converted by the SAR-ADC 10q is a digital signal converted from the quadrature phase signal. The detailed SAR-ADCs 10i and 10q are described later.

The digital signal processor 26 is a module that decodes the digital baseband signals B inputted from the SAR-ADCs 10i and 10q, and outputs the decoded digital baseband signal B(D) to a wireless communication device (not illustrated) such as a chip for a mobile phone or a wireless LAN (Local Area Network).

Figure 2:
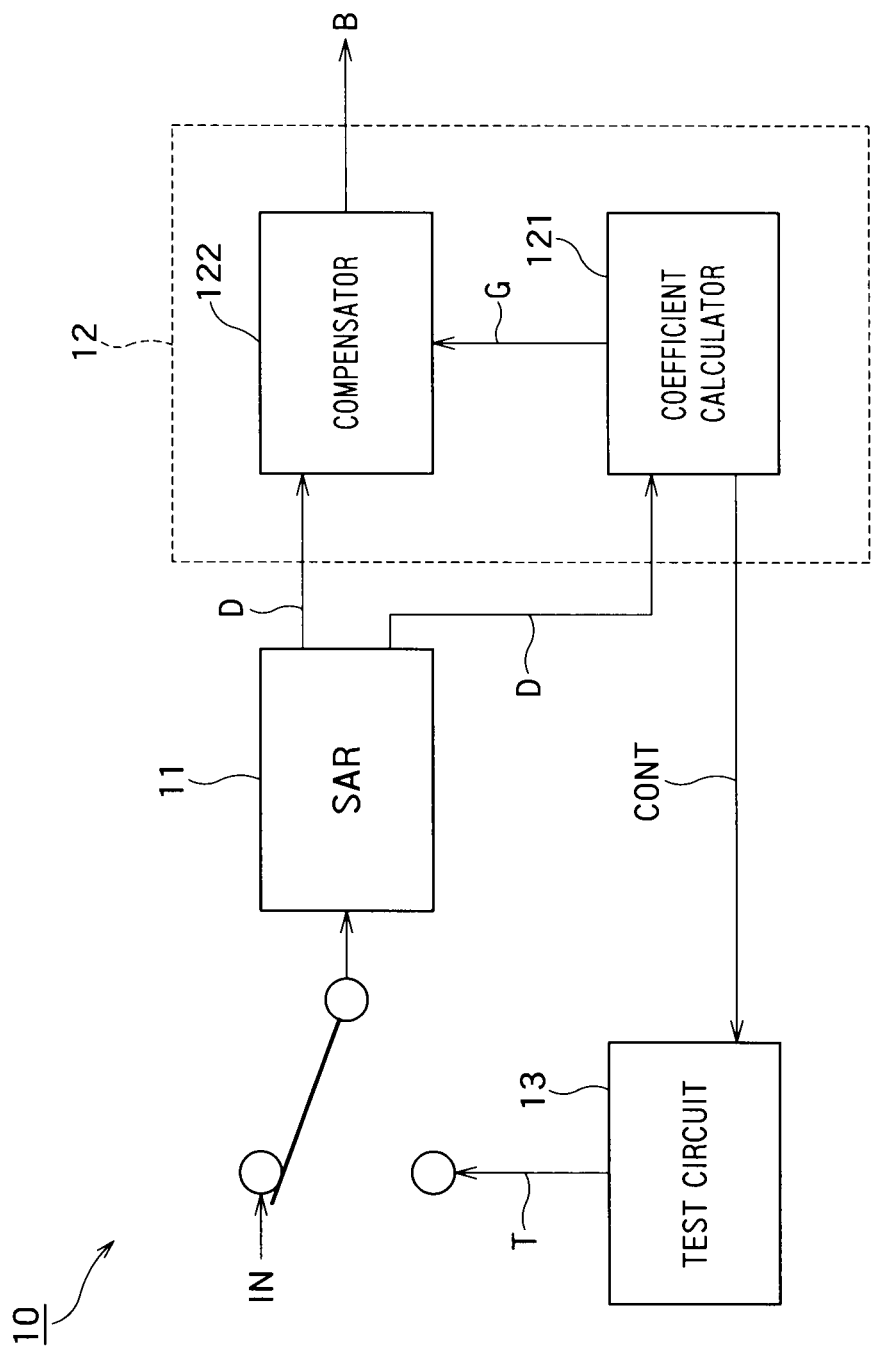
FIG. 2 is a schematic diagram illustrating detailed configurations of the SAR-ADCs 10$i$ and 10$q$ of FIG. 1.

Then, the SAR-ADCs 10i and 10q will be explained in detail. FIG. 2 is a schematic diagram illustrating detailed configurations of the SAR-ADCs 10i and 10q of FIG. 1. Because the configuration of the SAR-ADC 10i of FIG. 1 is identical to that of the SAR-ADC 10q, hereinafter the SAR-ADCs 10i and 10q are referred to as a SAR-ADC10. The analog input signals IN(I) and IN(Q) of FIG. 1 are referred to as an analog input signal IN. The digital baseband signals B(I) and B(Q) of FIG. 1 are referred to as a digital baseband signal B.

As illustrated in FIG. 2, the SAR-ADC 10 includes a successive approximation register (hereinafter referred to as "SAR") 11, a digital correction circuit 12, and a test circuit 13.

The SAR 11 is an n-bit (n is an integer greater than 1) converter weighted by a binary weight. The SAR 11 converts the analog input signal IN inputted from the frequency converters 25i and 25q of FIG. 1 or an analog test signal T inputted from the test circuit 13 into a digital output code D, and inputs the converted digital output code D to the digital correction circuit 12. The detailed SAR 11 is described later.

The digital correction circuit 12 is circuit that corrects the digital output code D inputted from the SAR 11. The digital correction circuit 12 includes a coefficient calculator 121 and a compensator 122.

The coefficient calculator 121 is a module that calculates a correction coefficient G used to correct the digital output code D. The digital output code D inputted from the SAR 11 to the coefficient calculator 121 corresponds to the analog test signal T. The coefficient calculator 121 calculates the correction coefficient G based on the digital output code D corresponding to the analog test signal T and inputs the calculated correction coefficient G to the compensator 122. The correction coefficient G is kept constant irrespective of the number of bits (value of n) of the SAR 11.

The compensator 122 is a module that generates the digital baseband signal B by correcting the digital output code D inputted from the SAR 11 using the correction coefficient G inputted from the coefficient calculator 121 and inputs the generated digital baseband signal B to the digital signal processor 26 of FIG. 1. The digital output code D inputted from the SAR 11 to the compensator 122 corresponds to the analog input signal IN. The detailed compensator 122 is described later.

The test circuit 13 is circuit that generates the analog test signal T based on a control signal CONT inputted from the coefficient calculator 121. For example, the test circuit 13 generates the analog test signal T using a reference voltage or a ground voltage as described later. Therefore, the test circuit 13 can be shrunk.

Figure 3:
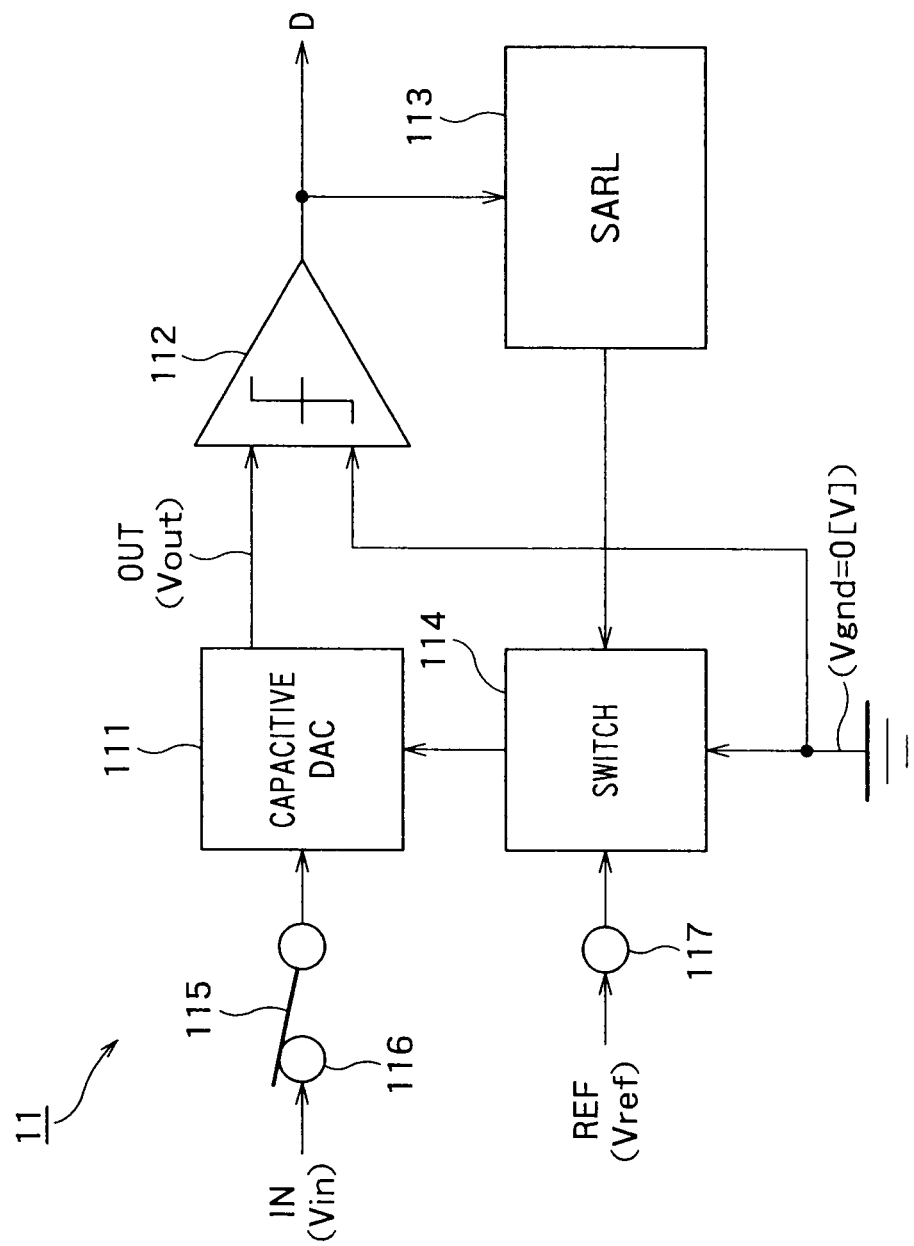
FIG. 3 is a schematic diagram illustrating a configuration of the SAR 11 of FIG. 2.

Then, the SAR 11 of FIG. 2 will be explained in detail. FIG. 3 is a schematic diagram illustrating a configuration of the SAR 11 of FIG. 2.

As illustrated in FIG. 3, the SAR 11 includes a capacitive DAC 111, a comparator 112, a successive approximation register logic (hereinafter referred to as "SARL") 113, switches 114 and 115, an input terminal 116, and a reference terminal 117.

An input signal IN is inputted to the input terminal 116. That is, a voltage (hereinafter referred to as "input voltage") Vin of the input signal IN is applied to the input terminal 116.

A reference signal REF is inputted to the reference terminal 117. That is, a voltage (hereinafter referred to as "reference voltage") Vref of the reference signal REF is applied to the reference terminal 117.

The capacitive DAC 111 is connected to the input terminal 116 and the reference terminal 117 or a ground. The switch 114 is connected among the reference terminal 117, the ground, the capacitive DAC 111, and the SARL 113. The switch 115 is located between the capacitive DAC 111 and the input terminal 116. When the switches 114 and 115 are turned, the input voltage Vin and a ground voltage Vgnd (Vgnd=0 [V]) are supplied to the capacitive DAC 111. The capacitive DAC 111 inputs an output signal OUT based on the input voltage Vin and the ground voltage Vgnd to the comparator 112.

A voltage (hereinafter referred to as "output voltage Vout") of the output signal OUT and the ground voltage Vgnd are supplied to the comparator 112. The comparator 112 compares the output voltage Vout with the ground voltage Vgnd, and outputs the digital output code D in accordance with a difference between the output voltage Vout and the ground voltage Vgnd to the coefficient calculator 121 or compensator 122 of FIG. 2 and the SARL 113. The digital output code D is a binary code indicating whether the output voltage Vout is larger than the ground voltage Vgnd or not. For example, the digital output code D indicates "1" (high) when the output voltage Vout is equal to or higher than the ground voltage Vgnd, and the digital output code D indicates "0" (low) when the output voltage Vout is lower than the ground voltage Vgnd.

The SARL 113 is a logic circuit that turns the switch 114 based on the digital output code D inputted from the comparator 112. According to the SARL 113, the voltage (reference voltage Vref or ground voltage Vgnd) supplied to the capacitive DAC 111 is changed.

In other words, in the SAR 11, the capacitive DAC 111 samples the analog input signal IN, and the voltage (reference voltage Vref or ground voltage Vgnd) supplied to the capacitive DAC 111 is changed based on the digital output code D outputted from the comparator 112, thereby obtaining the digital output code D corresponding to the output signal OUT.

Figure 4:
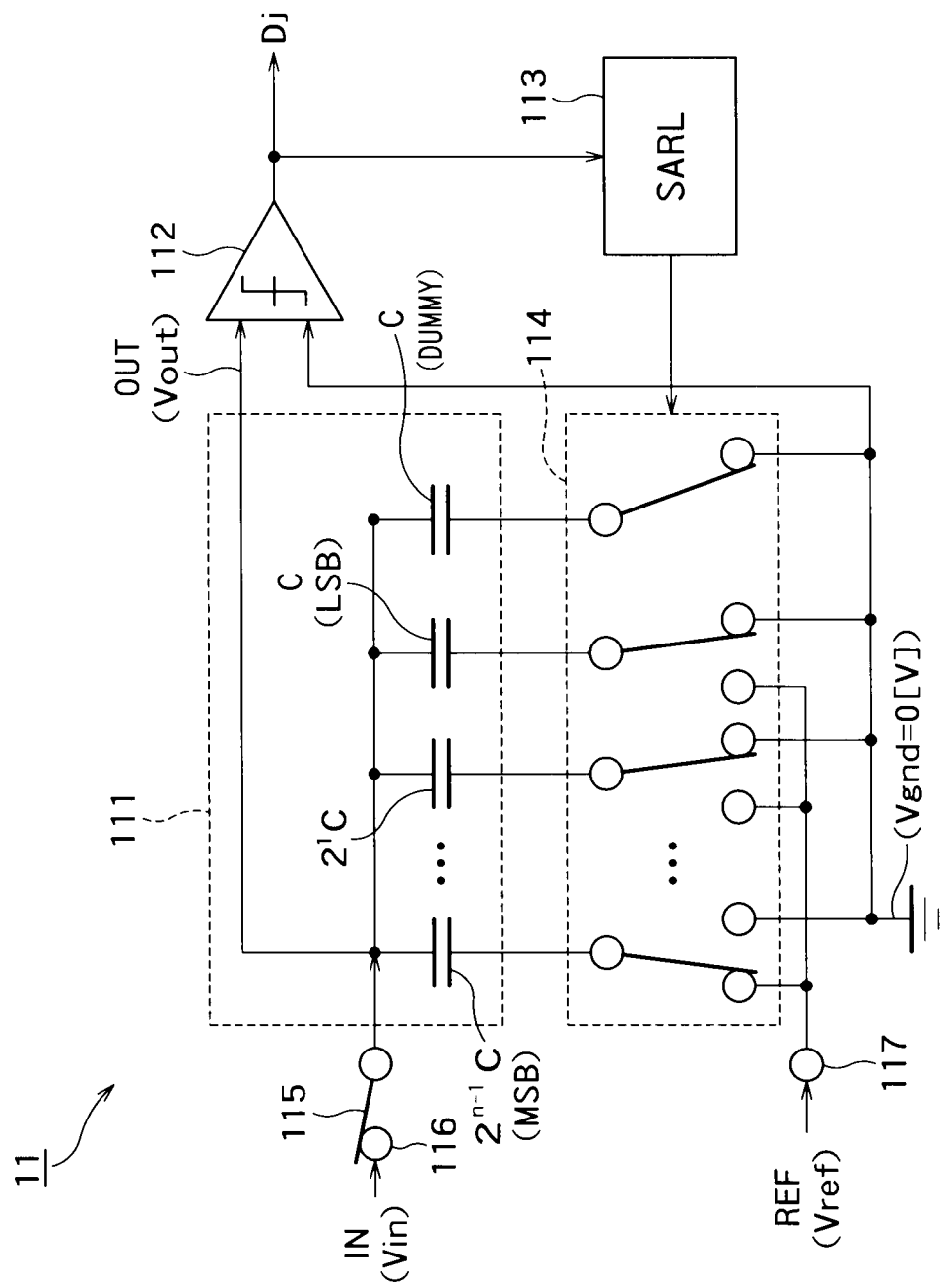
FIG. 4 is a model for illustrating the operation principle of the SAR 11 of FIG. 2.

An operation principle of the SAR-ADC will be explained below. FIG. 4 is a model for illustrating the operation principle of the SAR 11 of FIG. 2.

As illustrated in FIG. 4, the SAR 11 includes the n-bit capacitive DAC 111 that is weighted by the binary weight, the comparator 112, the SARL 113, and the switch 114.

The capacitive DAC 111 includes n capacitors and a dummy capacitor. Assuming that j (j is an integer of 1 to n) is the number of bits corresponding to the capacitors, the capacitor corresponding to the j bit has a capacitance of That is, the capacitor corresponding to Least Significant Bit (hereinafter referred to as "LSB") (j=1) has a capacitance of $2^0$ C. (=C), and the capacitor corresponding to Most Significant Bit (hereinafter referred to as "MSB") (j=n) has the capacitance of $2^{n-1}$C. The dummy capacitor has a capacitance C equal to that of the capacitor corresponding to the LSB.

The SAR 11 is operated in the order of the sampling and the AD conversion.

In the sampling, a charge corresponding to a potential difference between the input voltage Vin and the ground voltage Vgnd is charged in all the capacitors of the capacitive DAC 111. Therefore, the input signal IN is sampled.

In the AD conversion, the switch 114 is turned according to the digital output code D. Therefore, the reference terminal 117 or the ground is connected to the n capacitors except the dummy capacitor. Specifically, the capacitor corresponding to the j bits is connected to the reference terminal 117 when a digital output code Dj that is of the j-bit digital output code is "1", and the capacitor corresponding to the j bits is connected to the ground when the digital output code Dj is "0". Therefore, the analog input signal IN is converted into the digital output code Dj.

The following equation 1 expresses the output voltage Vout in an n-bit successive approximation operation of the capacitance DAC 111. As expressed by the equation 1, the AD conversion is performed using a binary digit in the n-bit successive approximation operation of the capacitance DAC 111. Accordingly, a radix of the capacitance DAC 111 becomes 2.

$$Vout = Vin - \sum_{j=1}^{n} \frac{1}{2^{n+1-j}} D_j Vref \qquad \text{(equation 1)}$$

Figure 5A:
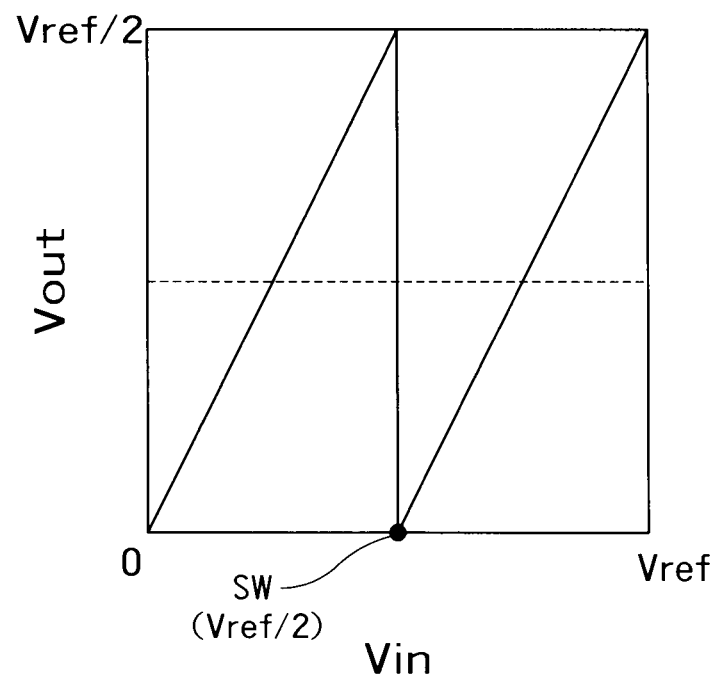
FIG. 5A is a graph illustrating a transfer characteristic (relationship between input voltage Vin and output voltage Vout) of the MSB (j=n) in the capacitive DAC 111 of FIG. 4.
Figure 5B:
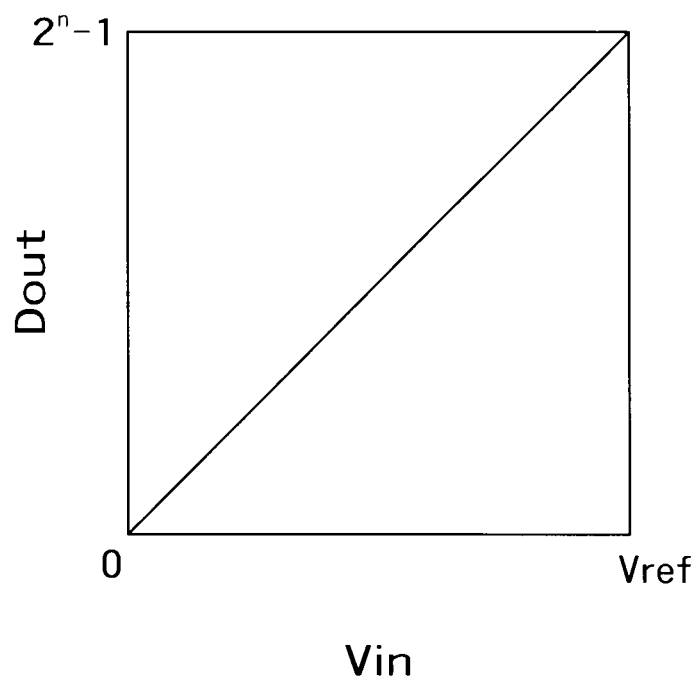
FIG. 5B is a graph illustrating a transfer characteristic (relationship between input voltage Vin and digital output Dout) of the whole capacitive DAC 111 of FIG. 4.

FIG. 5A is a graph illustrating a transfer characteristic (relationship between input voltage Vin and output voltage Vout) of the MSB (j=n) in the capacitive DAC 111 of FIG. 4. FIG. 5B is a graph illustrating a transfer characteristic (relationship between input voltage Vin and digital output Dout) of the whole capacitive DAC 111 of FIG. 4. In a digital output Dout, the digital output code D of the binary digit is expressed by a decimal digit, and the output codes of samples are expressed in the form of a straight line while one sample corresponds to one output code.

As illustrated in FIG. 5A, "Vout=Vin" is obtained for "0≦Vin≦Vref/2", and "Vout=Vin−Vref/2" is obtained for "Vin>Vref/2". That is, the switch 114 of FIG. 4 is turned at a point (hereinafter referred to as "switching point SW") of Vin=Vref/2. On the other hand, as illustrated in FIG. 5B, the output voltage Vout corresponds to the input voltage Vin on one-on-one level. That is, the input voltage Vin is fixed when the output voltage Vout is fixed. A range (hereinafter referred to as "output range") of the digital output Dout reaches a full scale ($2^n-1$).

Figure 6:
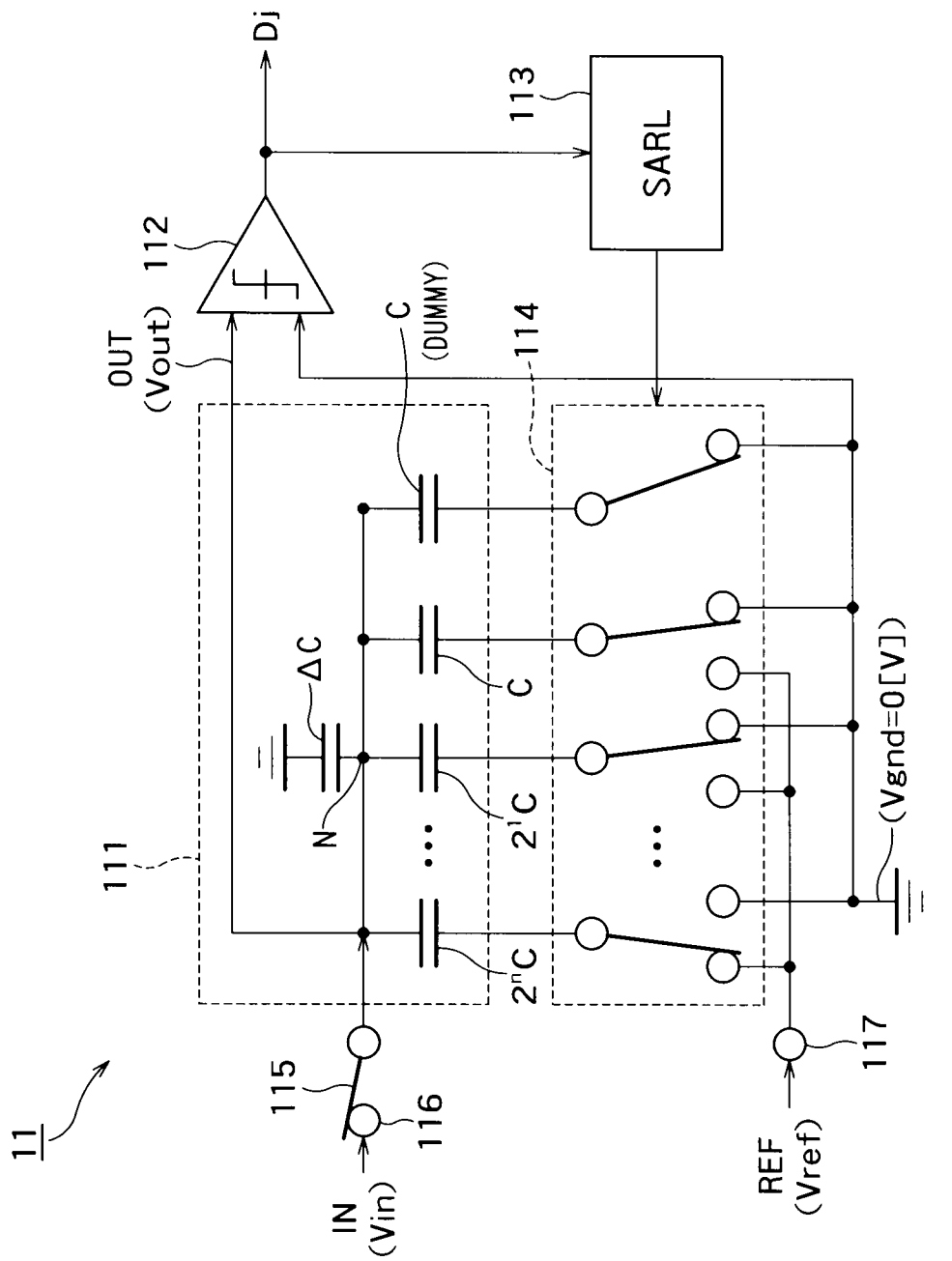
FIG. 6 is a schematic diagram illustrating the parasitic capacitance that is parasitic in the capacitive DAC 111 of FIG. 4.

The capacitive DAC 111 will be explained below in consideration of a parasitic capacitance. FIG. 6 is a schematic diagram illustrating the parasitic capacitance that is parasitic in the capacitive DAC 111 of FIG. 4.

As illustrated in FIG. 6, the parasitic capacitance having a capacitance ΔC is parasitic in a node on a side of the input terminal 116. The output voltage Vout is expressed by the following equation 2 in the successive approximation operation of the MSB (j=n).

$$Vout = Vin - \frac{1}{2}\left(\frac{C}{C + \Delta C/4}\right) Vref \qquad \text{(equation 2)}$$

Figure 7A:
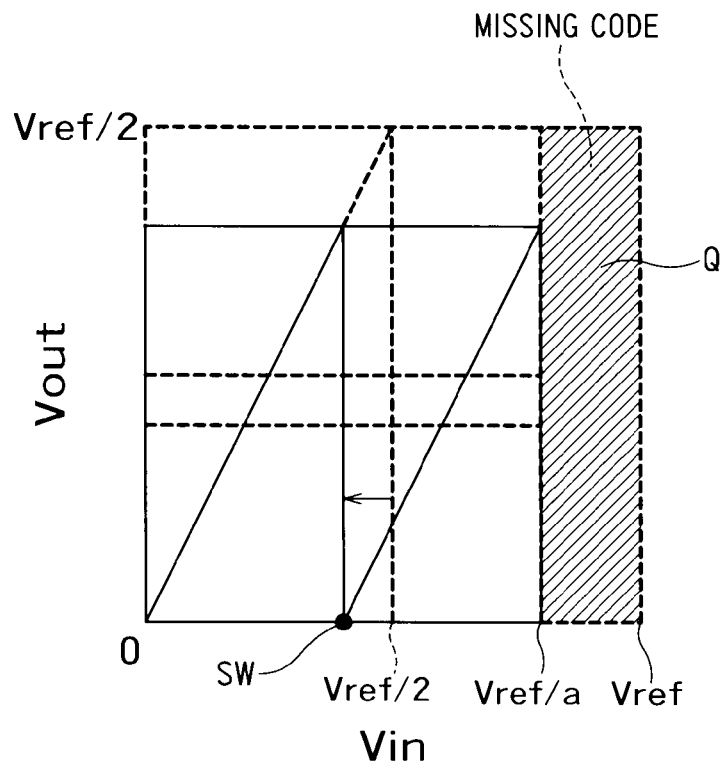
FIG. 7A is a graph illustrating the transfer characteristic (relationship between input voltage Vin and output voltage Vout) of the MSB (j=n) in the capacitive DAC 111 of FIG. 6.
Figure 7B:
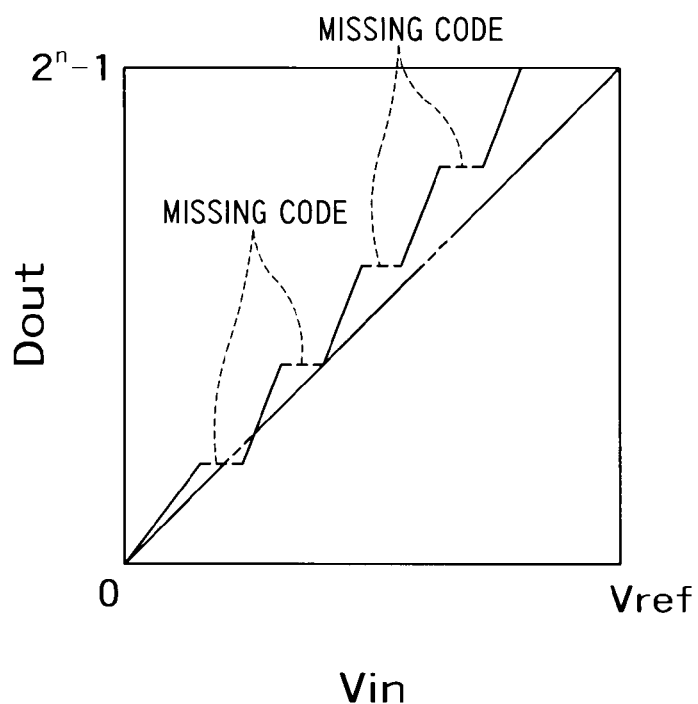
FIG. 7B is a graph illustrating the transfer characteristic (relationship between input voltage Vin and digital output Dout) of the whole capacitive DAC 111 of FIG. 6.

FIG. 7A is a graph illustrating the transfer characteristic (relationship between input voltage Vin and output voltage Vout) of the MSB (j=n) in the capacitive DAC 111 of FIG. 6. FIG. 7B is a graph illustrating the transfer characteristic (relationship between input voltage Vin and digital output Dout) of the whole capacitive DAC 111 of FIG. 6.

Compared with the graph of FIG. 5A, FIG. 7A illustrates the fact that a range (hereinafter referred to as "input range") of the input voltage Vin is decreased by an influence of the parasitic capacitance. Because the capacitance ΔC is greater than 0 in the equation 2, a coefficient of the reference voltage Vref is less than ½. That is, the radix of the SAR 11 is larger than 2. As illustrated in FIG. 7A, because the switching point SW is shifted toward a direction in which the input voltage Vin is decreased, the input voltage Vin at the switching point SW becomes smaller than Vref/2. As a result, the missing code is generated in a region Q (Vref/a<Vin<Vref, 1<a<2) out of the input range. On the other hand, as illustrated in FIG. 7B, the output voltage Vout does not correspond to the input voltage Vin on one-on-one level. That is, the input voltage Vin is not fixed when the output voltage Vout is fixed. In other words, FIG. 7B illustrates the fact that the missing code is generated in each cycle due to the decrease of the input range greater than 2 bits (broken-line portion of FIG. 7B).

Then the compensator 122 and the SAR 11 of FIG. 2 will be explained in detail.

First Embodiment

A first embodiment of the invention will be explained. In the first embodiment, the SAR 11 of FIG. 2 includes an SAR that is implemented by a C-2C type capacitive DAC. Descriptions of contents similar to the contents already described above are not repeated here.

Figure 8:
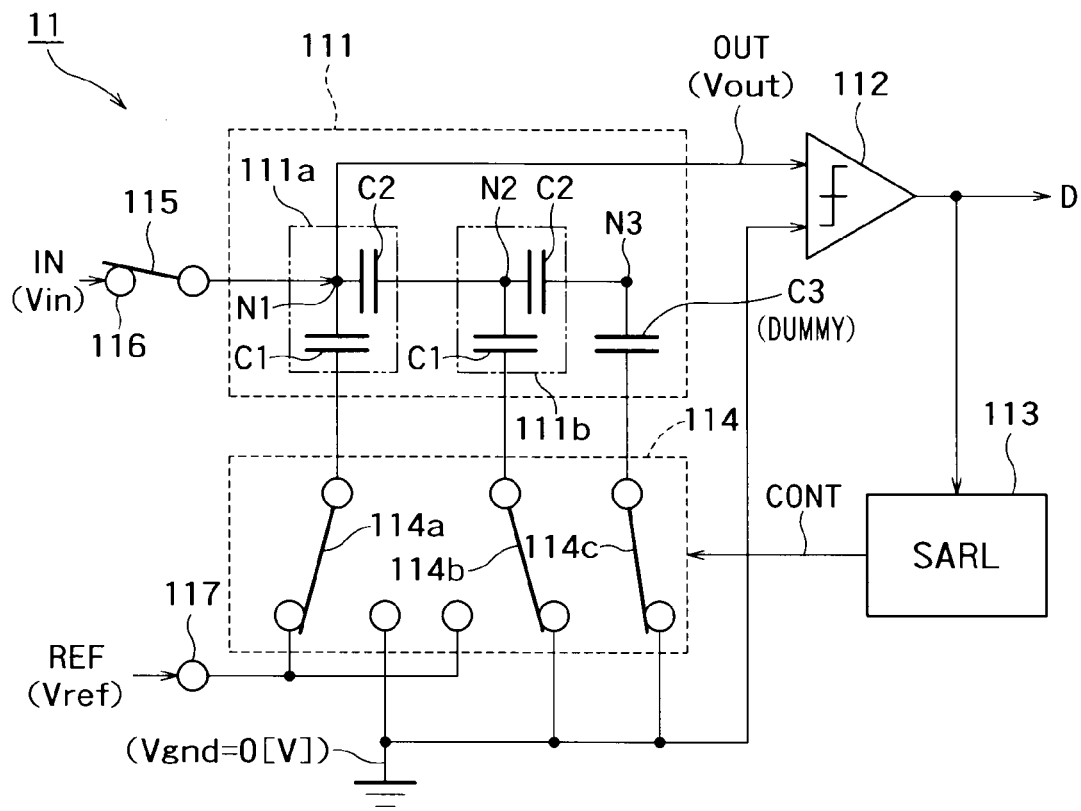
FIG. 8 is a schematic diagram illustrating a configuration of the SAR 11 of the first embodiment.

FIG. 8 is a schematic diagram illustrating a configuration of the SAR 11 of the first embodiment.

As illustrated in FIG. 8, the SAR 11 of the first embodiment includes the capacitive DAC 111 that is implemented by the C-2C type capacitive DAC, the comparator 112, the SARL 113, the switches 114 and 115, the input terminal 116, and the reference terminal 117. The comparator 112, the SARL 113, the switches 114 and 115, the input terminal 116, and the reference terminal 117 are similar to those of FIG. 3.

The capacitive DAC 111 includes a first capacitor set 111a, a second capacitor set 111b, and a dummy capacitor having a third capacitance C3. Each of the first capacitor set 111a and the second capacitor set 111b includes a first capacitor having a first capacitance C1 and a second capacitor having a second capacitance C2 that is double the first capacitance C1. The third capacitance C3 is a difference between the first capacitance C1 and a correction capacitance. The correction capacitance is lower than the first capacitance C1, and is equal to or greater than the parasitic capacitance that is parasitic in the first capacitor set 111a. The first capacitor of the first capacitor set 111a corresponds to the MSB. The first capacitor of the second capacitor set 111b corresponds to the LSB. The comparator 112 and the switch 115 that is connected to the input terminal 116 are connected to a node N1 between the first capacitor and second capacitor of the first capacitor set 111a. The second capacitor of the first capacitor set 111a is connected to a node N2 between the first capacitor and second capacitor of the second capacitor set 111b. The second capacitor of the second capacitor set 111b is connected to a node N3 to which the dummy capacitor is connected. The dummy capacitor is connected to the ground through a switch 114c.

Although the first embodiment is the example of the capacitive DAC 111 that is implemented by the 2 capacitor sets (that is, 2-bit C-2C type capacitive DAC), the invention can also be applied to the capacitive DAC 111 that is implemented by an n capacitor sets (that is, n-bit C-2C type capacitive DAC).

Figure 9:
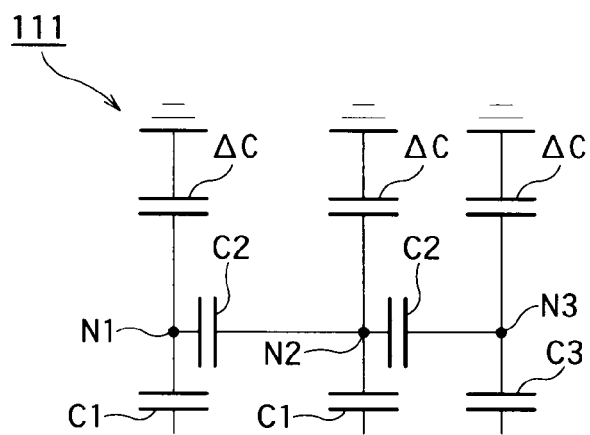
FIG. 9 is a schematic diagram illustrating the parasitic capacitance that is parasitic in the capacitive DAC 111 of FIG. 8.

The parasitic capacitance that is parasitic in the capacitive DAC 111 of FIG. 8 will be described below. FIG. 9 is a schematic diagram illustrating the parasitic capacitance that is parasitic in the capacitive DAC 111 of FIG. 8.

As illustrated in FIG. 9, in the capacitive DAC 111 of FIG. 8, the parasitic capacitance having the capacitance $\Delta C$ is parasitic in each of the nodes N1 to N3. In the following description, it is assumed that the capacitance $\Delta C$ of the parasitic capacitance that is parasitic in each of the nodes N1 to N3 are equal to one another.

The transfer characteristic is expressed by an equation 3, when a switch 114a of FIG. 8 is connected to the reference terminal 117 while a switch 114b is connected to the ground.

$$Vout = Vin - \cfrac{C1}{C1 + \Delta C + C2 - \cfrac{C2^2}{C1 + 2C2 + \Delta C - \cfrac{C2^2}{C2 + C3 + \Delta C}}} \quad \text{(equation 3)}$$

The transfer characteristic is expressed by an equation 4, when the switch 114a of FIG. 8 is connected to the ground while the switch 114b is connected to the reference terminal 117.

$$Vout = Vin - \left(\cfrac{C1}{(C1 + \Delta C + C2) - \left(\cfrac{C2^2}{(C1 + 2C2 + \Delta C) - \left(\cfrac{C2^2}{C2 + C3 + \Delta C}\right)}\right)}\right) \times \left(\cfrac{C2}{(C1 + 2C2 + \Delta C) - \left(\cfrac{C2^2}{C2 + C3 + \Delta C}\right)}\right) Vref \quad \text{(equation 4)}$$

The equation 3 and the equation 4 illustrate the fact that the parasitic capacitance having the capacitance $\Delta C$ can be corrected by setting the first capacitance C1 satisfying an equation 5 and the third capacitance C3 satisfying an equation 6.

$$C1 = \frac{C2}{2} - \Delta C \quad \text{(equation 5)}$$

$$C3 = C2 - \Delta C \quad \text{(equation 6)}$$

An equation 7 and an equation 8 are obtained when the equation 5 and the equation 6 are substituted for the equation 3 and the equation 4, respectively.

$$Vout = Vin - \frac{1}{2}\left(1 - \frac{2\Delta C}{C2}\right)V'ref = Vin - \frac{1}{G}V'ref \quad \text{(equation 7)}$$

$$Vout = Vin - \frac{1}{2}\left(1 - \frac{2\Delta C}{C2}\right)V'ref = Vin - \frac{1}{2G}V'ref \quad \text{(equation 8)}$$

An equation 9 is obtained from the equation 7 and the equation 8. The equation 9 illustrates the fact that, even if the input range is decreased by half, the generation of the missing code generated by the decrease of the input range can be suppressed by doubling the reference voltage Vref.

$$\frac{1}{G} = 1 - \frac{2\Delta C}{C2} \quad \text{(equation 9)}$$

$$V'ref = \frac{Vref}{2}$$

Each of the first capacitance C1 and the second capacitance C2 is set so as to satisfy an equation 10. Therefore, the correction coefficient G becomes lower than 2. As a result, as expressed by the equation 7, the radix of the MSB of the capacitive DAC 111 is lower than 2. As expressed by the equation 8, the radixes except the MSB become 2.

$$C1 = \frac{C2}{2} - \Delta C > 0 \quad \text{(equation 10)}$$

$$C2 > 2\Delta C$$

Figure 12:
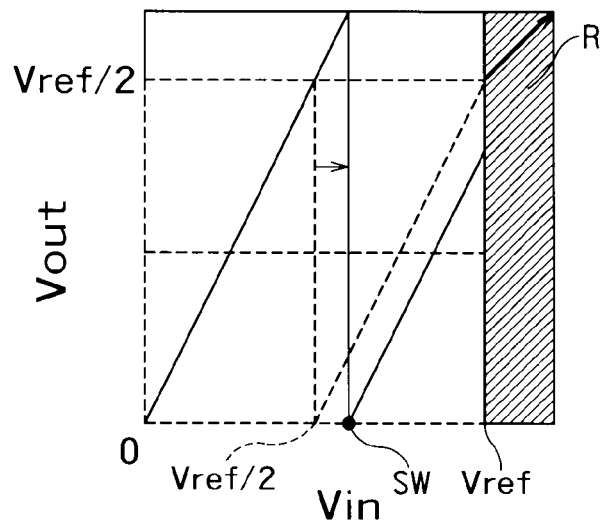
FIG. 12 is a graph illustrating the transfer characteristic (relationship between input voltage Vin and output voltage Vout) of the MSB (j=n) in the capacitive DAC 111 of FIG. 10.

FIG. 12 is a graph illustrating the transfer characteristic (relationship between input voltage Vin and output voltage Vout) of the MSB (j=n) in the capacitive DAC 111 of FIG. 8.

Figure 13A:
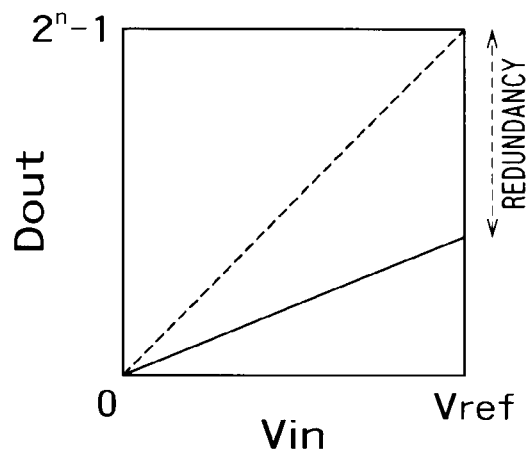
FIG. 13A is a graph illustrating the transfer characteristic of the SAR 11 before the compensator 122 of FIG. 2 performs the correction.
Figure 13B:
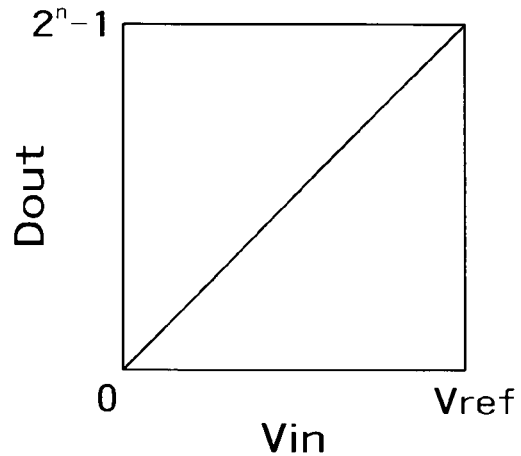
FIG. 13B is a graph illustrating the transfer characteristic of the SAR 11 after the compensator 122 of FIG. 2 performs the correction.

FIG. 13A is a graph illustrating the transfer characteristic of the SAR 11 before the compensator 122 of FIG. 2 performs the correction. FIG. 13B is a graph illustrating the transfer characteristic of the SAR 11 after the compensator 122 of FIG. 2 performs the correction.

As expressed by the equation 7, the coefficient of the reference voltage V'ref is greater than ½. That is, the radix of the MSB is lower than 2. Accordingly, as illustrated in FIG. 12, the switching point SW is shifted toward the direction in which the input voltage Vin is increased. Compared with the graph of FIG. 5A, FIG. 12 illustrates the fact that the input range expands because the influence of the parasitic capacitance is eliminated. A region R where the input range expands corresponds to the redundancy. In FIG. 13A, due to the redundancy, the output range does not reach the full scale (Vin=Vref and Dout=$2^n-1$) that can be outputted by the binary digit. In FIG. 13B, the output range reaches the full scale.

In other words, the SAR 11 of the first embodiment includes the input terminal 116, the reference terminal 117, the first capacitor set 111a, the second capacitor set 111b, the dummy capacitor, the comparator 112, the switch 114, and the logic (SARL 113). The input voltage Vin is applied to the input terminal 116. The reference voltage Vref is applied to the reference terminal 117. The first capacitor set 111a includes the first capacitor having the first capacitance C1 and the second capacitor having the second capacitance C2. The second capacitance C2 is double the sum of the first capacitance C1 and the parasitic capacitance that is parasitic in the first capacitor set. The input terminal 116 is connected to the node N1 between the first capacitor and the second capacitor. The second capacitor set 111b includes the first capacitor and the second capacitor. The second capacitor of the first capacitor set 111a is connected to the node N2 between the first capacitor and the second capacitor of the second capacitor set 111b. The dummy capacitor having the third capacitance C3 that is lower than the second capacitance C2 is located between the second capacitor of the second capacitor set 111b and the ground. The comparator 112 compares the ground voltage Vgnd with the output voltage Vout corresponding to the charge charged in the first capacitor and second capacitor of the first capacitor set 111a, and outputs the digital output code D in accordance with the difference between the output voltage Vout and the ground voltage Vgnd. The switch 114 is connected among the reference terminal 117 and the first capacitors of the first capacitor set 111a and second capacitor set 111b. The logic (SARL 113) turns the switch 114 to control the output voltage Vout based on the digital output code D of the comparator 112.

Then the compensator 122 of FIG. 2 of the first embodiment will be explained in detail.

As described above, the digital output code D having the transfer characteristic of FIG. 13A is inputted to the compensator 122 of FIG. 2.

In order to expand the output range to the full scale, the compensator 122 of FIG. 2 multiplies the digital output code D having the transfer characteristic of FIG. 13A by a predetermined range correction coefficient H (H=G/2). The range correction coefficient H (H=G/2) depends on the correction coefficient G inputted from the coefficient calculator 121. Therefore, the digital output code D having the transfer characteristic (that is, transfer characteristic similar to that of FIG. 5B) of the SAR 11, in which the output range reaches the full scale, is obtained as illustrated in FIG. 13B. The digital output code D having the transfer characteristic of FIG. 13B corresponds to the digital baseband signal B of FIG. 2.

According to the first embodiment, because the capacitance AC of the parasitic capacitance is previously set using the parasitic capacitance extracting tool, the correction coefficient G of FIG. 2 is kept constant to simplify the redundant conversion algorithm of the compensator 122. As a result, the digital correction circuit 12 and test circuit 13 can be shrunk.

Second Embodiment

A second embodiment will be explained below. In the second embodiment, the SAR 11 of FIG. 2 includes an SAR that is implemented by a 2-bit binary weight type capacitive DAC. Descriptions of contents similar to the contents already described above are not repeated here.

Figure 10:
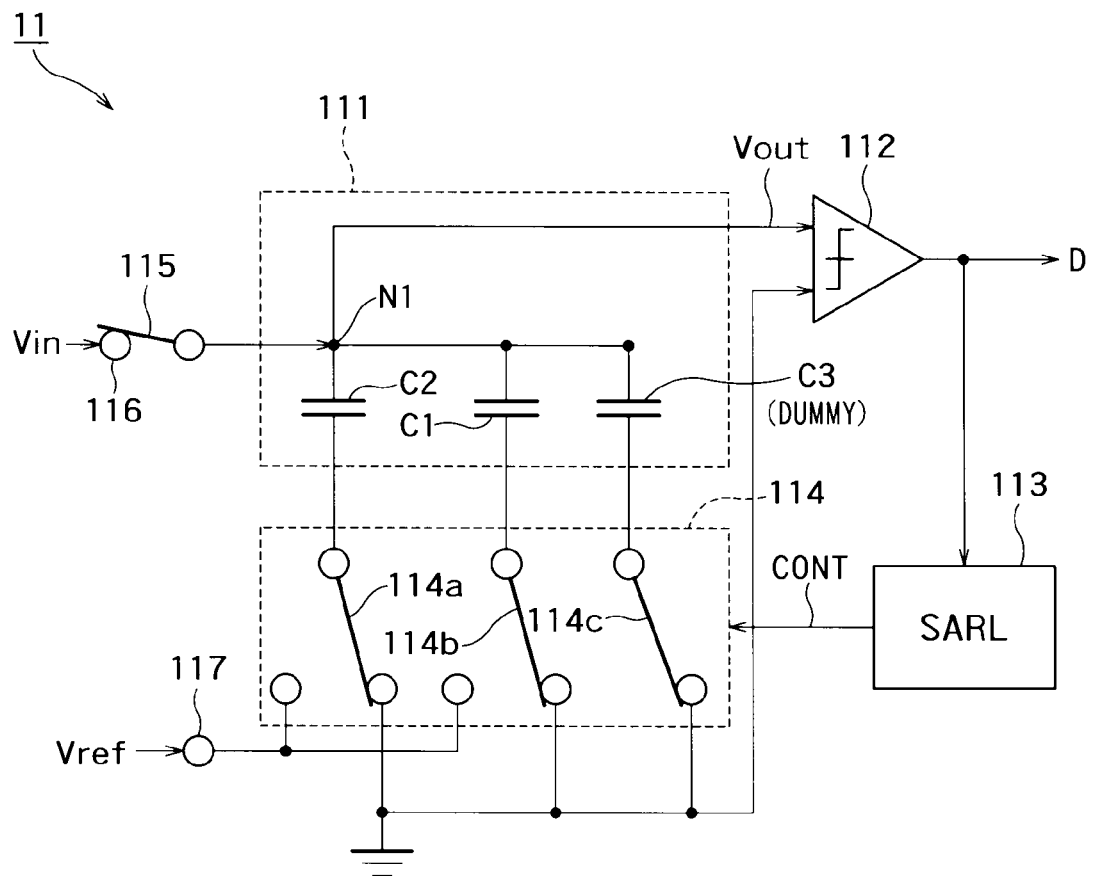
FIG. 10 is a schematic diagram illustrating a configuration of the SAR 11 of the second embodiment.

FIG. 10 is a schematic diagram illustrating a configuration of the SAR 11 of the second embodiment.

As illustrated in FIG. 10, the SAR 11 of the second embodiment includes the capacitive DAC 111 that is implemented by the 2-bit binary weight type capacitive DAC, the comparator 112, the SARL 113, the switches 114 and 115, the input terminal 116, and the reference terminal 117. The comparator 112, the SARL 113, the switches 114 and 115, the input terminal 116, and the reference terminal 117 are similar to those of FIG. 3.

The capacitive DAC 111 includes the first capacitor having the first capacitance C1, the second capacitor having the second capacitance C2, and the dummy capacitor having the third capacitance C3. The first capacitor, the second capacitor, and the dummy capacitor are connected in parallel. The second capacitor corresponds to the MSB. The first capacitor corresponds to the LSB. The switch 115 and the comparator 112 are connected to the node N1. The dummy capacitor is connected to the input terminal 116 and the ground. The second capacitance C2 is set so as to satisfy an equation 11.

$$C2=2C1 \qquad \text{(equation 11)}$$

Figure 11:
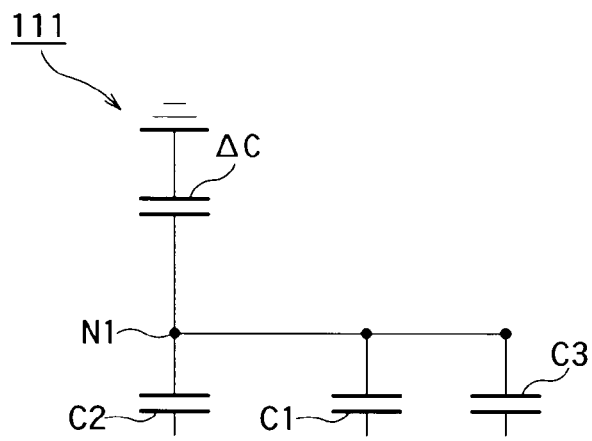
FIG. 11 is a schematic diagram illustrating the parasitic capacitance that is parasitic in the capacitive DAC 111 of FIG. 10.

The parasitic capacitance that is parasitic in the capacitive DAC 111 of FIG. 10 will be explained below. FIG. 11 is a schematic diagram illustrating the parasitic capacitance that is parasitic in the capacitive DAC 111 of FIG. 10.

As illustrated in FIG. 11, in the capacitive DAC 111 of FIG. 10, the parasitic capacitance having the capacitance AC is parasitic in the node N1.

The third capacitance C3 of FIG. 10 is set so as to satisfy an equation 12. In the equation 12, a correction capacitance Ccal is used to correct the performance degradation caused by the parasitic capacitance. The correction capacitance Ccal is equal to or greater than the parasitic capacitance ΔC, and is lower than the first capacitance C1.

$$C3=C1-Ccal \qquad \text{(equation 12)}$$

In consideration of the equation 11 and the equation 12, the output voltage Vout is expressed by an equation 13. As expressed by the equation 13, in the case that the capacitive DAC 111 converts the MSB, the radix becomes lower than 2, and the coefficient of the reference voltage Vref becomes greater than ½.

$$Vout = Vin - \frac{1}{2}\left(\frac{C1}{C1-\frac{Ccal}{4}}\right)Vref \qquad \text{(equation 13)}$$

FIG. 12 is a graph illustrating the transfer characteristic (relationship between input voltage Vin and output voltage Vout) of the MSB (j=n) in the capacitive DAC 111 of FIG. 10.

As expressed by the equation 13, the coefficient of the reference voltage Vref is greater than ½. That is, the radix of the capacitive DAC 111 of FIG. 10 is lower than 2. Accordingly, as illustrated in FIG. 12, the switching point SW is shifted toward the direction in which the input voltage Vin of FIG. 12 is increased. Compared with the graph of FIG. 5A, FIG. 12 illustrates the fact that the input range expands because the influence of the parasitic capacitance is eliminated. The region R where the input range expands corresponds to the redundancy.

In other words, the SAR11 of the second embodiment includes the input terminal 116, the reference terminal 117, the first capacitor, the second capacitor, the dummy capacitor, the comparator 112, the switch 114, and the logic (SARL 113). The input voltage Vin is applied to the input terminal 116. The reference voltage Vref is applied to the reference terminal 117. The first capacitor has the first capacitance C1. The second capacitor has the second capacitance C2 that is double the first capacitance C1. The dummy capacitor has the third capacitance C3. The third capacitance C3 is a difference between the first capacitance C1 and the correction capacitance Ccal. The correction capacitance Ccal is lower than the first capacitance C1 of the first capacitor, and is equal to or greater than the capacitance AC of the parasitic capacitance that is parasitic in the first capacitor. The comparator 112 compares the ground voltage Vgnd with the output voltage Vout corresponding to the charges charged in the first capacitor, the second capacitor, and the dummy capacitor, outputs the digital output code D in accordance with the difference between the ground voltage Vgnd and the output voltage Vout. The switch 114 is located between the reference terminal 117 and the first capacitor and second capacitor. The logic (SARL 113) controls the switch 114 to control the output voltage Vout based on the digital output code D.

The compensator 122 and coefficient calculator 121 of FIG. 2 of the second embodiment are similar to those of the first embodiment.

According to the second embodiment, the capacitance AC of the parasitic capacitance is previously estimated using the parasitic capacitance extracting tool, the third capacitance C3 of the dummy capacitor is set so as to satisfy the equation 12 in the range where the redundancy is secured. Therefore, the correction coefficient G of FIG. 2 is kept constant to simplify the redundant conversion algorithm of the compensator 122. As a result, the digital correction circuit 12 and test circuit 13 can be shrunk.

Figure 14:
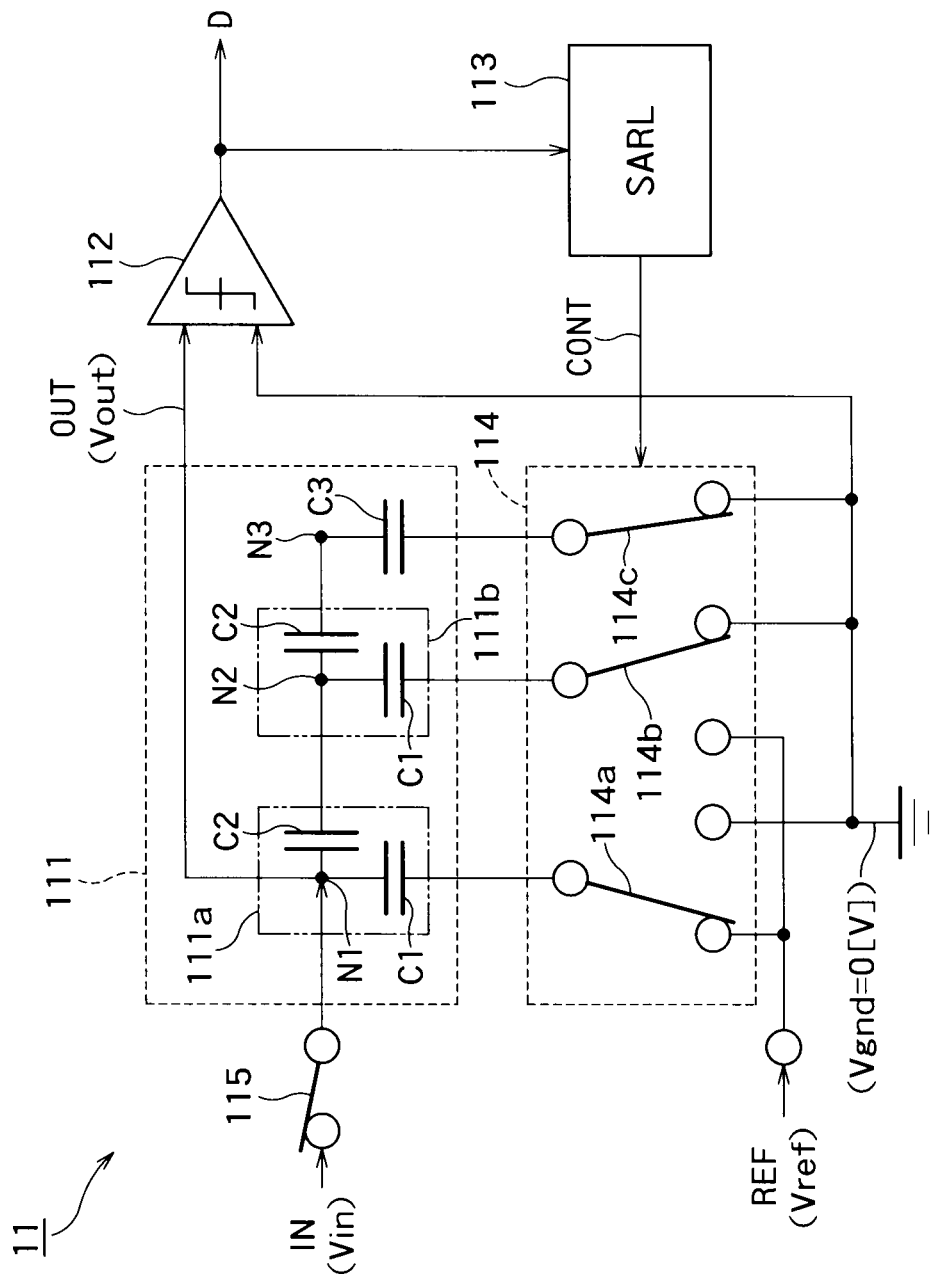
FIG. 14 is a schematic diagram illustrating the configuration of the receiver of the variation of the first embodiment.

In the second embodiment, by way of example, the third capacitance C3 of the dummy capacitor is set so as to satisfy the equation 12 in the capacitive DAC 111 of FIG. 10 that is implemented by the 2-bit binary weight type capacitive DAC. Alternatively, the third capacitance C3 of the dummy capacitor may be set so as to satisfy the equation 12 in the capacitive DAC 111 of FIG. 8 that is implemented by the C-2C type capacitive DAC (see FIG. 14).

The larger amount of redundancy can be secured with increasing correction capacitance Ccal. Therefore, the amount of mismatch error can be relaxed. However, the output range is decreased with increasing correction capacitance Ccal. Accordingly, the proper correction capacitance Ccal is preferably set according to the resolution required for the SAR 11.

Further, a receiver according the embodiment includes an input terminal to which an input voltage is applied, a reference terminal to which a reference voltage is applied, a first capacitor having a first capacitance, a second capacitor having a second capacitance being double the first capacitance, a dummy capacitor having a third capacitance being a difference between the first capacitance and a correction capacitance, the correction capacitance being less than the first capacitance and equal to or greater than a parasitic capacitance being parasitic in the first capacitor, a comparator configured to compare an output voltage corresponding to charges charged in the first capacitor, the second capacitor, and the dummy capacitor with a ground voltage, and output a digital output code in accordance with a deference between the output voltage and the ground voltage, a switch located among the first capacitor, the second capacitor, and the reference terminal, a logic circuit configured to turn the switch based on the digital output code to control the output voltage, and a digital correction circuit configured to correct the digital output code. Also, the receiver includes a test circuit configured to generate an analog test signal to be supplied to the digital correction circuit using the reference voltage or the ground voltage.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A successive approximation register-analog digital converter comprising:
an input terminal to which an input voltage is applied;
a reference terminal to which a reference voltage is applied;
a first capacitor set comprising a first capacitor and a second capacitor, the first capacitor having a first capacitance, the second capacitor having a second capacitance being double a sum of the first capacitance and a parasitic capacitance being parasitic in the first capacitor set;
a second capacitor set comprising the first capacitor and the second capacitor;
a dummy capacitor having a third capacitance being less than the second capacitance and located between the second capacitor of the second capacitor set and a ground;
a comparator configured to compare an output voltage corresponding to charges charged in the first capacitor of the first capacitor set and the second capacitor of the first capacitor set with a ground voltage, and output a digital output code in accordance with a difference between the output voltage and the ground voltage;
a plurality of switches, each of the switches being connected to the first capacitor of the first capacitor set, the first capacitor of the second capacitor set, and the reference terminal; and
a logic circuit configured to turn on and turn off the switches based on the digital output code to control the output voltage,
wherein the input terminal is located between the first capacitor of the first capacitor set and the second capacitor of the first capacitor set, and
the second capacitor of the first capacitor set is located between the first capacitor of the second capacitor set and the second capacitor of the second capacitor set.

2. The converter of claim 1, wherein the third capacitance is a difference between the first capacitance and a correction capacitance, the correction capacitance being less than the first capacitance and equal to or greater than the parasitic capacitance.

3. A receiver comprising:
an input terminal to which an input voltage is applied;
a reference terminal to which a reference voltage is applied;
a first capacitor set comprising a first capacitor and a second capacitor, the first capacitor having a first capacitance, the second capacitor having a second capacitance being double a sum of the first capacitance and a parasitic capacitance being parasitic in the first capacitor set;
a second capacitor set comprising the first capacitor and the second capacitor;
a dummy capacitor having a third capacitance being less than the second capacitance and located between the second capacitor of the second capacitor set and a ground;
a comparator configured to compare an output voltage corresponding to charges charged in the first capacitor of the first capacitor set and the second capacitor of the first capacitor set with a ground voltage, and output a digital output code in accordance with a difference between the output voltage and the ground voltage;
a plurality of switches, each of the switches being connected to the first capacitor of the first capacitor set, the first capacitor of the second capacitor set, and the reference terminal; and
a logic circuit configured to turn on and turn off the switches based on the digital output code to control the output voltage; and
a digital correction circuit configured to correct the digital output code,
wherein the input terminal is located between the first capacitor of the first capacitor set and the second capacitor of the first capacitor set, and
the second capacitor of the first capacitor set is located between the first capacitor of the second capacitor set and the second capacitor of the second capacitor set.

4. The receiver of claim 3, wherein the third capacitance is a difference between the first capacitance and a correction capacitance, the correction capacitance being less than the first capacitance and equal to or greater than the parasitic capacitance.

5. The receiver of claim 4, further comprising a test circuit configured to generate an analog test signal to be supplied to the digital correction circuit using the reference voltage.

6. The receiver of claim 4, further comprising a test circuit configured to generate an analog test signal to be supplied to the digital correction circuit using the ground voltage.

7. The receiver of claim 3, further comprising a test circuit configured to generate an analog test signal to be supplied to the digital correction circuit using the reference voltage.

8. The receiver of claim 3, further comprising a test circuit configured to generate an analog test signal to be supplied to the digital correction circuit using the ground voltage.

* * * * *